United States Patent [19]
Werker

[11] Patent Number: 5,471,512
[45] Date of Patent: Nov. 28, 1995

[54] PHASE-LOCKED LOOP CONFIGURATION

[75] Inventor: Heinz Werker, Taufkirchen, Germany

[73] Assignee: Siemens Aktiengesellschaft, Munich, Germany

[21] Appl. No.: 285,399

[22] Filed: Aug. 3, 1994

[30] Foreign Application Priority Data

Aug. 3, 1993 [DE] Germany ............ 43 26 062.4

[51] Int. Cl.⁶ .................. H03L 7/06; H03K 5/159; G06F 1/12
[52] U.S. Cl. .................. 375/376; 375/374; 326/95; 327/158; 327/160; 327/161
[58] Field of Search .................. 375/374, 376; 327/156–158, 160, 161; 331/1 R, 12, 14, 25, 1 A; 326/95

[56] References Cited

U.S. PATENT DOCUMENTS

| | | | |
|---|---|---|---|
| 4,489,342 | 12/1984 | Gollinger et al. | 327/152 |
| 4,806,804 | 2/1989 | O'Leary | 327/277 |
| 4,899,070 | 2/1990 | Ou et al. | 327/51 |
| 5,036,528 | 7/1991 | Costantino et al. | 375/374 |
| 5,285,483 | 2/1994 | Ogawa et al. | 375/120 |
| 5,319,680 | 6/1994 | Port et al. | 375/119 |
| 5,363,419 | 11/1994 | Ho | 375/120 |
| 5,375,148 | 12/1994 | Parker et al. | 375/120 |

FOREIGN PATENT DOCUMENTS

| | | |
|---|---|---|
| 0235303 | 9/1987 | European Pat. Off. . |
| 0329418 | 8/1989 | European Pat. Off. . |

OTHER PUBLICATIONS

IEEE Journal of Solid-State Circuits, vol. 21, No. 5 Oct. 1988 (Johnson et al.) pp. 1218–1223, "A Variable Delay Line PLL for CPU–Coprocessor Synchronization".

Australian Patent Abstract No. AU–A–24503/84, Backes et al., Aug. 23, 1984.

*Primary Examiner*—Young Tse
*Attorney, Agent, or Firm*—Herbert L. Lerner; Laurence A. Greenberg

[57] ABSTRACT

A phase-locked loop configuration includes a controllable delay device having a signal path with at least one inverter having supply lines, at least one field effect transistor having a load path, and at least one capacitor connecting the load path transversely to the signal path. A phase detector receives a reference signal and receives an input signal through the delay device. A first controller is connected downstream of the phase detector for controlling the load path of the at least one field effect transistor in the delay device. At least one pair of further field-effect transistors has load paths connected into the supply lines of the at least one inverter. A second controller is connected downstream of the phase detector for controlling the load paths of the further field effect transistors.

4 Claims, 1 Drawing Sheet

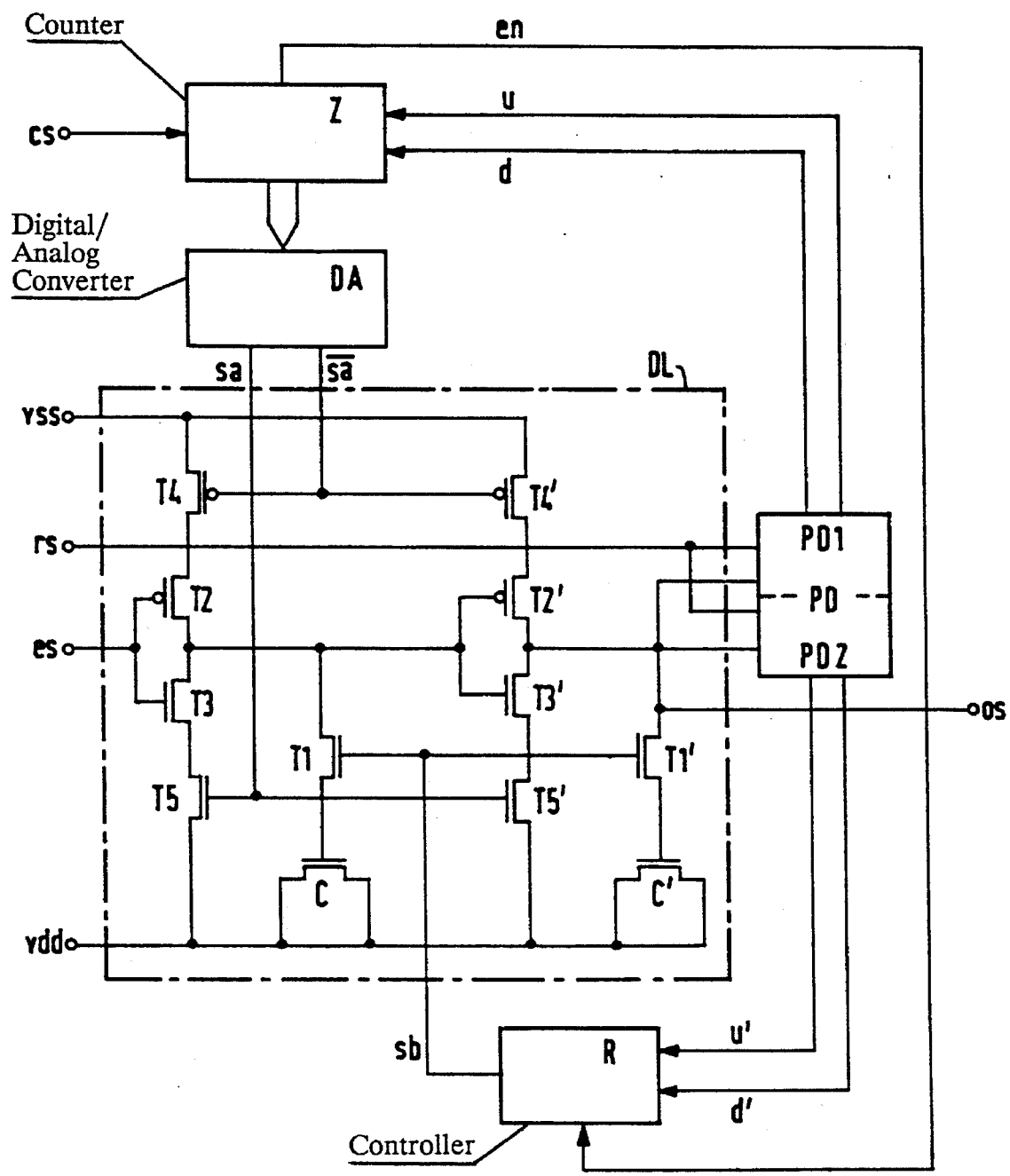

PHASE-LOCKED LOOP CONFIGURATION

BACKGROUND OF THE INVENTION

FIELD OF THE INVENTION

The invention relates to a phase-locked loop configuration having a phase detector to which a reference signal and an input signal conducted through a controllable delay device, are applied, a controller connected downstream of the phase detector for controlling the load path of at least one field effect transistor in the delay device, the load path being connected transversely to the signal path through a (respective) capacitor, and at least one inverter in the signal path of the delay device.

Such a phase-locked loop configuration is known, for instance, from an article by M. G. Johnson and E. L. Hudson, entitled "A Variable Delay Line PLL for CPU-Coprocessor Synchronization" in IEEE Journal of Solid-State Circuits, Vol. 23, No. 5, October 1988, and is discussed therein with a view toward using it for synchronizing two processors. When two processors, such as a central processing unit and a coprocessor, are operated on one bus, production-dictated phase shifts in the equal-frequency signal clock pulses of the two processors relative to one another often arise, which at the least hinder both in achieving regulated bus access. In order to synchronize the two signal clock pulses, phase-locked loops are proposed, which have a controllable delay device instead of a controlled oscillator circuit.

In the aforementioned article, two different types of delay devices are compared with one another for that purpose. One is a circuit with an inverter, having a supply current which is reduced by means of field effect transistors as a function of a control voltage, and the other is the circuit that was already mentioned at the outset, having a serial RC member formed of a capacitor and the load path of a field effect transistor. The time constant of the RC member is variable by means of the control voltage. The inverter circuit is distinguished by a wide delay range, but is very inaccurate. In comparison, the circuit with the RC member is substantially more favorable. On the other hand, its delay range is quite limited. In order to nevertheless achieve a wide delay range and high accuracy, it is proposed that a plurality of circuits with RC members be connected in series, with inverters disposed between them. The disadvantage then, however, is that a relatively high number of individual circuits is required to achieve an adequate delay range. However that means that numerous capacitors are required, which take up a very large amount of surface area in integration.

SUMMARY OF THE INVENTION

It is accordingly an object of the invention to provide a phase-locked loop configuration, which overcomes the hereinafore-mentioned disadvantages of the heretofore-known devices of this general type.

With the foregoing and other objects in view there is provided, in accordance with the invention, a phase-locked loop configuration, comprising a controllable delay device having a signal path with at least one inverter having supply lines, at least one field effect transistor having a load path, and at least one capacitor connecting the load path transversely to the signal path; a phase detector receiving a reference signal and receiving an input signal through the delay device; a first controller connected downstream of the phase detector for controlling the load path of the at least one field effect transistor in the delay device; at least one pair of further field-effect transistors having load paths connected into the supply lines of the at least one inverter; and a second controller connected downstream of the phase detector for controlling the load paths of the further field effect transistors.

In accordance with another feature of the invention, the second controller has a digital/analog converter for controlling the further field effect transistors, a counter clocked by a clock signal is connected upstream of the converter, and the counting direction of the counter is controlled by the phase detector.

In accordance with a further feature of the invention, the first controller is deactivated until a quasi-stationary control state of the second controller is reached, and once the quasi-stationary control state is reached, it is maintained and the first controller is activated.

In accordance with an added feature of the invention, the time constant of the first controller is chosen to be less than the time constant of the further controller.

In accordance with a concomitant feature of the invention, the phase detector includes two mutually independent partial detectors being respectively triggered by the reference signal and the input signal and each partial detector triggering a respective one of the two controllers.

Other features which are considered as characteristic for the invention are set forth in the appended claims.

Although the invention is illustrated and described herein as embodied in a phase-locked loop configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The FIGURE of the drawing is a schematic and block circuit diagram of an exemplary embodiment of the invention.

DESCRIPTION OF THE PREFERRED EMBODIMENTS

Referring now to the single figure of the drawing in detail, there is seen an exemplary embodiment in which two series-connected inverters are provided as a controllable delay device DL. Each inverter includes a gate-coupled and drain-coupled field effect transistor pair of opposite conduction types. Accordingly, an input signal es is applied to interconnected gate terminals of a field effect transistor T2 of the p-channel type and a field-effect transistor T3 of the n-channel type. Coupled drain terminals of these two transistors are in turn carried to coupled-together gate terminals of a field effect transistor T2' of the p-channel type and a field effect transistor T3' of the n-channel type, having interconnected drain terminals which form an output of the delay device DL. Load paths of field-effect transistors T4, T4', T5, T5' are connected into supply lines of the inverters. The field-effect transistors T4, T4', T5, T5' are controlled by differential control signals sa, $\overline{sa}$. To that end, drain terminals of the two field-effect transistors T4, T4' of the p-channel type are each connected to the source terminal of a respective one of the field-effect transistors T2 and T2'. Source terminals of the field-effect transistors T4, T4' are connected to a positive supply potential vss. Correspondingly, the two field-effect transistors T5 and T5' of the n-channel type have drain terminals each being connected to the source terminal of a respective one of the field-effect transistors T3 and T3'. Source terminals of the field-effect transistors T5 and T5' are connected to a negative supply potential vdd.

Capacitors C and C' are each connected in parallel with an output of one of the inverters through a load path of a respective field-effect transistor T1 and T1' of the n-channel type. Field-effect transistors of the n-channel type that are likewise used as the capacitors C and C' have drain and source terminals which are applied to the negative supply potential vdd and each have a gate terminal which is connected to the source terminal of a respective one of the field-effect transistors T1 or T1'. The field-effect transistors T1 and T1' have drain terminals which are each connected to the output of a respective one of the inverters. The gate terminals of the two field-effect transistors T1 and T1' are triggered by a control signal sb. The control signals sa, $\overline{sa}$ and sb are configured in such a way that they compensate for the temperature drift in the field-effect transistors driven by them. This is the case, for instance, if the various field-effect transistors each form the output circuit of a current mirror having an input circuit which forms the respective control signal sa, $\overline{sa}$ and sb.

The differential control signals sa and $\overline{sa}$ are generated by a digital/analog converter DA as a function of the counter state of a counter Z, which is clocked by a clock signal cs and has a counting direction that is reversible by control signals u and d. The digital/analog converter DA and the counter Z form a controller. The control signal sb is likewise generated by a controller, namely a controller R which, for instance, includes a reversible bipolar charge pump with a following filter. According to a feature of the invention, a time constant of the controller R is less than a time constant, dependent on the clock signal cs, of the controller formed by the digital/analog converter DA and the counter Z. A control signal en can be generated after a certain period of time has elapsed after startup, in order to activate the controller R, or by means of a logical linkage of the signals u and d. Once the control signal en is generated, the counter state of the counter Z is maintained and the controller R is activated.

Triggering of the two controllers is carried out by means of a phase detector PD which includes two mutually independent partial detectors PD1 and PD2, according to a feature of the invention. Both partial detectors PD1 and PD2 are triggered with the output signal os of the delay device DL and with a reference signal rs. The partial detector PD1 generating the control signals u and d has a detection range over a plurality of phases with low accuracy, while the partial detector PD2 generating control signals u' and d' for triggering the controller R has only a small detection range but relatively high accuracy. Nevertheless, in the same way, it is still possible to use only a single phase detector that then controls both controllers.

Finally, it should be pointed out that the control circuit or phase locked loop can be split at any arbitrary point and expanded by means of further units. For instance, in order to synchronize a central processing unit and a coprocessor, a processor clock signal is supplied to the central processing unit, which has a defined gate path, through a fixedly defined delay device. The signal at the output of this gate path furthermore serves as the reference signal rs. The processor clock signal is provided as the input signal es. The coprocessor is then clocked with the output signal os of the controllable delay device DL, which has a gate path identical to that of the CPU. The gate path is connected between the controllable delay device DL and the phase detector PD. The signals being output to a common bus by the two processors are thus adapted to one another. In addition to that possible use, the phase-locked loop configuration according to the invention is also suitable for all other uses of a phase-locked loop configuration familiar to one skilled in the art.

I claim:

1. A phase-locked loop configuration, comprising:

a controllable delay device receiving an input signal and producing an output signal, said delay device having a signal path with at least one inverter having supply lines, at least one field effect transistor having a load path, and at least one capacitor connecting the load path transversely to the signal path, said field effect transistor being connected in series with said at least one capacitor and said field effect transistor and said capacitor being connected in parallel with said at least one inverter;

a phase detector receiving a reference signal and the output signal of said delay device;

a first controller connected downstream of said phase detector for controlling the load path of said at least one field effect transistor in said delay device;

said delay device further including at least one pair of further field-effect transistors having load paths connected into the supply lines of said at least one inverter; and a second controller connected downstream of said phase detector for controlling the load paths of said further field effect transistors;

wherein said second controller has a digital/analog converter for controlling said further field effect transistors, and a counter being connected upstream of said digital/analog converter and being clocked by a clock signal, said counter having a counting direction controlled by said phase detector.

2. A phase-locked loop configuration, comprising:

a controllable delay device receiving an input signal and producing an output signal, said delay device having a signal path with at least one inverter having supply lines, at least one field effect transistor having a load path, and at least one capacitor connecting the load path transversely to the signal path, said field effect transistor being connected in series with said at least one capacitor and said field effect transistor and said capacitor being connected in parallel with said at least one inverter;

a phase detector receiving a reference signal and the output signal of said delay device;

a first controller connected downstream of said phase detector for controlling the load path of said at least one field effect transistor in said delay device;

said delay device further including at least one pair of further field-effect transistors having load paths connected into the supply lines of said at least one inverter; and a second controller connected downstream of said phase detector for controlling the load paths of said further field effect transistors;

wherein said first controller is deactivated until a quasi-stationary control state of said second controller is reached, and once the quasi-stationary control state is reached it is maintained and said first controller is activated.

3. A phase-locked loop configuration, comprising:

a controllable delay device receiving an input signal and producing an output signal, said delay device having a signal path with at least one inverter having supply lines, at least one field effect transistor having a load path, and at least one capacitor connecting the load path transversely to the signal path, said field effect transistor being connected in series with said at least one capacitor and said field effect transistor and said capacitor being connected in parallel with said at least one inverter A a phase detector receiving a reference signal and the output signal of said delay device;

a first controller connected downstream of said phase detector for controlling the load path of said at least one field effect transistor in said delay device;

said delay device further including at least one pair of further field-effect transistors having load paths connected into the supply lines of said at least one inverter; and a second controller connected downstream of said phase detector for controlling the load paths of said further field effect transistors;

wherein said controllers have time constants, and the time constant of said first controller is less than the time constant of said second controller.

4. A phase-locked loop configuration, comprising:

a controllable delay device receiving an input signal and producing an output signal, said delay device having a signal path with at least one inverter having supply lines, at least one field effect transistor having a load path, and at least one capacitor connecting the load path transversely to the signal path, said field effect transistor being connected in series with said at least one capacitor and said field effect transistor and said capacitor being connected in parallel with said at least one inverter;

a phase detector receiving a reference signal and the output signal of said delay device;

a first controller connected downstream of said phase detector for controlling the load path of said at least one field effect transistor in said delay device;

said delay device further including at least one pair of further field-effect transistors having load paths connected into the supply lines of said at least one inverter; and a second controller connected downstream of said phase detector for controlling the load paths of said further field effect transistors;

wherein said phase detector includes two mutually independent partial detectors being respectively triggered by the reference signal and the input signal, and each of said partial detectors triggers a respective one of said two controllers.

* * * * *